US010068974B2

(12) United States Patent
Li et al.

(10) Patent No.: US 10,068,974 B2
(45) Date of Patent: Sep. 4, 2018

(54) FIELD PLATE POWER DEVICE AND METHOD OF MANUFACTURING THE SAME

(71) Applicant: Gpower Semiconductor, Inc., Suzhou (CN)

(72) Inventors: Yuan Li, Nijmegen (NL); Yi Pei, Suzhou (CN); Feihang Liu, Suzhou (CN)

(73) Assignee: GPOWER SEMICONDUCTOR, INC. (CN)

( * ) Notice: Subject to any disclaimer, the term of this patent is extended or adjusted under 35 U.S.C. 154(b) by 0 days.

(21) Appl. No.: 15/442,644

(22) Filed: Feb. 25, 2017

(65) Prior Publication Data

US 2017/0170284 A1    Jun. 15, 2017

Related U.S. Application Data

(63) Continuation of application No. PCT/CN2015/077305, filed on Apr. 23, 2015.

(30) Foreign Application Priority Data

Sep. 1, 2014    (CN) .......................... 2014 1 0440179

(51) Int. Cl.
*H01L 29/40* (2006.01)
*H01L 29/778* (2006.01)
*H01L 29/423* (2006.01)

(52) U.S. Cl.
CPC .......... *H01L 29/402* (2013.01); *H01L 29/401* (2013.01); *H01L 29/7786* (2013.01); *H01L 29/4236* (2013.01); *H01L 29/42368* (2013.01); *H01L 29/42376* (2013.01)

(58) Field of Classification Search
CPC ..................................................... H01L 20/402
See application file for complete search history.

(56) References Cited

U.S. PATENT DOCUMENTS

| | | | |
|---|---|---|---|
| 8,389,977 B2 * | 3/2013 | Chu | H01L 29/861 257/194 |
| 9,024,324 B2 * | 5/2015 | Teplik | H01L 29/402 257/76 |
| 9,559,199 B2 * | 1/2017 | Imthurn | |
| 9,620,409 B2 * | 4/2017 | Kikuchi | H01L 21/765 |
| 2002/0155646 A1 * | 10/2002 | Petruzzello | H01L 29/402 438/149 |

(Continued)

*Primary Examiner* — William Coleman
(74) *Attorney, Agent, or Firm* — Flener IP & Business Law

(57) ABSTRACT

A field plate power device comprises: a substrate; a multilayer semiconductor layer disposed on the substrate; a source electrode, a drain electrode, and a gate electrode located between the source electrode and the drain electrode disposed on the multilayer semiconductor layer; a dielectric layer disposed on the gate electrode, a part of the multilayer semiconductor layer between the gate electrode and the source electrode and another part of the multilayer semiconductor layer between the gate electrode and the drain electrode; a groove disposed in a part of the dielectric layer between the gate electrode and the drain electrode; and a field plate disposed on the groove. The field plate comprises a first portion away from the gate electrode in a horizontal direction, the first portion has an overall upward tilted shape in the horizontal direction away from the gate electrode.

20 Claims, 15 Drawing Sheets

(56) References Cited

U.S. PATENT DOCUMENTS

| | | | |
|---|---|---|---|
| 2014/0264453 A1* | 9/2014 | Moens | H01L 29/66462 257/194 |
| 2015/0144953 A1* | 5/2015 | Hill | H01L 29/402 257/76 |
| 2016/0079373 A1* | 3/2016 | Uchihara | H01L 29/404 257/409 |
| 2017/0077282 A1* | 3/2017 | Lee | H01L 29/66462 |
| 2017/0207300 A1* | 7/2017 | Pei | H01L 29/0607 |
| 2017/0207335 A1* | 7/2017 | Lin | H01L 29/7816 |
| 2017/0263724 A1* | 9/2017 | Kodera | H01L 29/42376 |

* cited by examiner

FIELD PLATE POWER DEVICE AND METHOD OF MANUFACTURING THE SAME

CROSS-REFERENCE TO RELATED APPLICATIONS

This application is a continuation of international application No. PCT/CN2015/077305 filed on Apr. 23, 2015, which claims the benefit and priority of Chinese patent application No. 201410440179.2 filed on Sep. 1, 2014. Both applications are incorporated herein in their entirety by reference.

TECHNICAL FIELD

The disclosed embodiments relate to semiconductor technology, and more particularly to a field plate power device and a method of manufacturing the same.

BACKGROUND

A breakdown electric field intensity of the third-generation semiconductor gallium nitride (GaN) material is much higher than that of the first-generation semiconductor silicon (Si) material or the second-generation semiconductor gallium arsenide (GaAs) material, thus electronic devices based on gallium nitride are capable of withstanding higher operating voltages. In addition, gallium nitride can form a heterojunction together with other III-N compound semiconductors, and has a two-dimensional electron gas (2DEG) channel with high concentration. Therefore, GaN High Electron Mobility Transistors (HEMTs) are much suitable for the manufacture of high-power electronic devices due to their characteristics of high voltages and high currents, which brings a good prospect.

The HEMT device is a kind of planar channel field effect transistors in which most of the electric field lines are gathered at an edge of a gate electrode adjacent to a drain electrode so as to form a high electric field spike. As a voltage applied between the gate electrode and the drain electrode increases, the electric field intensity at this position will increase rapidly, so that the gate leaking current is increased. Such a high electric field in a local region will easily cause the device to fail due to avalanche breakdown, thus reducing the breakdown voltage of the device. Meanwhile, with increase of working time, the high electric field will cause degradation or denaturation of a surface dielectric layer or a semiconductor material layer, thus affecting reliability of the device and reducing lifetime of the device.

A field plate is usually placed at a side of the gate electrode near the drain electrode in the prior art, so as to reduce the strong electric field in the vicinity of the gate electrode of the device, thereby improving the breakdown voltage of the device and obtaining excellent reliability. FIG. 1 illustrates a field plate power device according to the prior art. As shown in FIG. 1, a field plate power device comprises: a substrate 101; a nucleation layer 102, a buffer layer 103, a channel layer 104 and a barrier layer 105 sequentially stacked on the substrate 101; a source electrode 106, a drain electrode 107, and a gate electrode 108 between the source electrode 106 and the drain electrode 107 disposed on the barrier layer 105; a dielectric layer 109 disposed on the gate electrode 108, a part of the barrier layer 105 between the gate electrode 108 and the source electrode 106 and another part of the barrier layer 105 between the gate electrode 108 and the drain electrode 107; and a metal field plate 110 disposed on the dielectric layer 109.

A bottom of the metal field plate 110 is substantially parallel to the barrier layer 105. The metal field plate 110 is connected to the source electrode 106 or the gate electrode 108, and generates an additional potential in the gate-drain region. Therefore, the electric field spike near an edge of the gate electrode 108 adjacent to the drain electrode 107 can be suppressed, and the breakdown voltage of the device and the reliability of the device can be improved. However, since the bottom of the field plate is substantially parallel to the surface of the barrier layer 105, although the electric field spike near the edge of the gate electrode 108 can be reduced, a new low electric field spike will be formed near an end of the field plate. The new electric field spike will increase as the length of the field plate increases, which will lead to breakdown or failure in the region near the end of the field plate. Accordingly, the problem of breakdown of the device has not been solved fundamentally, and the risk of breakdown is just transferred to another region. In addition, if a field plate is too long, a relatively high parasitic capacitance will be generated, which will affect high frequency power characteristics of the device.

In order to address such an issue, a field plate structure in which a plurality of layers, e.g., three layers, are stacked is utilized in the prior art, so as to form a gradient distribution of electric potential. Such a field plate structure with gradient distribution should be made by multi-step lithography, dielectric deposition, metal deposition and other processes, the production process is complicated and the manufacturing cost of the device is increased. Moreover, for such a multi-leveled field plate, it is difficult to evenly distribute the electric field on the surface of the device, thus an excellent device performance is difficult to be obtained.

SUMMARY

In view of the above, the embodiments of the present invention provide a field plate power device in which the electric field spike at the surface of the device is suppressed, the regions vulnerable to breakdown are eliminated, the overall breakdown voltage of the device and the high frequency characteristics of the device are improved, and the manufacturing cost is decreased. The embodiments of the present invention also provide a method of manufacturing such a field plate power device.

According to an embodiment of the present invention, a field plate power device comprises: a substrate; a multilayer semiconductor layer disposed on the substrate; a source electrode, a drain electrode, and a gate electrode located between the source electrode and the drain electrode disposed on the multilayer semiconductor layer; a dielectric layer disposed on the gate electrode, a part of the multilayer semiconductor layer between the gate electrode and the source electrode and another part of the multilayer semiconductor layer between the gate electrode and the drain electrode; a groove disposed in a part of the dielectric layer between the gate electrode and the drain electrode; and a field plate disposed on the groove, wherein the field plate comprises a first portion away from the gate electrode in a horizontal direction, the first portion has an overall upward tilted shape in the horizontal direction away from the gate electrode.

In an embodiment, the overall upward tilted shape of the first portion is one of a linear shape, an upward convex curved shape and a downward convex curved shape or a combination thereof.

In an embodiment, the overall upward tilted shape of the first portion is a serrated shape.

In an embodiment, the overall upward tilted shape of the first portion is a stepped shape.

In an embodiment, an end of the field plate is connected to one of the source electrode, the gate electrode and a fixed potential electrode, or is in a floating state.

In an embodiment, the field plate further comprises a second portion connected to the first portion, the second portion has an overall downward tilted shape in the horizontal direction away from the gate electrode. The overall downward tilted shape of the second portion is one of a linear shape, an upward convex curved shape, a downward convex curved shape and a stepped shape or a combination thereof. A length of the first portion in the horizontal direction is greater than a length of the second portion in the horizontal direction. And the field plate may further comprise a fourth portion between the first portion and the second portion, the fourth portion has a horizontal straight linear shape.

In an embodiment, the field plate further comprises a second portion connected to the first portion, the second portion has a vertical straight linear shape.

In an embodiment, the multilayer semiconductor layer comprises a nucleation layer on the substrate, a buffer layer on the nucleation layer, a channel layer on the buffer layer and a barrier layer on the channel layer, wherein the channel layer and the barrier layer form a heterojunction structure, two-dimensional electron gas is formed at an interface of the heterojunction structure, the source electrode and the drain electrode respectively contact the two-dimensional electron gas. The multilayer semiconductor layer further comprises an insertion layer made of AlN between the channel layer and the barrier layer. The multilayer semiconductor layer further comprises a back barrier layer made of AlGaN between the buffer layer and the channel layer. The gate electrode is disposed on a surface of the barrier layer or at least partially disposed in a recess formed in the barrier layer.

In an embodiment, the field plate power device further comprises a gate dielectric layer between the multilayer semiconductor layer and the gate electrode, the gate dielectric layer is made of a material selected from a group consisting of SiN, $SiO_2$, SiON, $Al_2O_3$, $HfO_2$ and $HfAlO_x$ or a combination thereof.

In an embodiment, the gate electrode is a T-shaped gate electrode or a ramped gate electrode.

According to an embodiment of the present invention, a method of manufacturing a field plate power device comprises: forming a multilayer semiconductor layer on a substrate; forming a source electrode, a drain electrode, and a gate electrode between the source electrode and the drain electrode on the multilayer semiconductor layer; forming a dielectric layer on the gate electrode, a part of the multilayer semiconductor layer between the gate electrode and the source electrode and another part of the multilayer semiconductor layer between the gate electrode and the drain electrode; forming a groove in a part of the dielectric layer between the gate electrode and the drain electrode; and forming a field plate on the groove, the field plate comprising a first portion away from the gate electrode in a horizontal direction, the first portion having an overall upward tilted shape in the horizontal direction away from the gate electrode.

In an embodiment, forming the multilayer semiconductor layer on the substrate comprises: forming a nucleation layer on the substrate; forming a buffer layer on the nucleation layer; forming a channel layer on the buffer layer; and forming a barrier layer on the channel layer, wherein the channel layer and the barrier layer form a heterojunction structure, two-dimensional electron gas is formed at an interface of the heterojunction structure, the source electrode and the drain electrode respectively contact the two-dimensional electron gas.

In an embodiment, the groove is formed by a dry etching process or a wet etching process.

In an embodiment, the field plate is formed by one of a metal electron beam evaporation process, a metal sputtering process and a metal chemical vapor deposition process or a combination thereof.

With the field plate power device and the manufacturing method thereof, a major part of the field plate has an overall upward tilted shape in the direction away from the gate electrode, thus the electric field spike near an end of the field plate is suppressed, the overall electric field distribution is more uniform compared with the prior art. Furthermore, the electric field spike at an end of the gate electrode near the drain electrode is suppressed also, so that there is no obvious high electric field spike on the surface of the device, and the regions vulnerable to breakdown are eliminated. Therefore, the overall breakdown voltage of the device and the high frequency characteristics of the device are improved, and the processing difficulty and manufacturing cost is reduced.

BRIEF DESCRIPTION OF DRAWINGS

These and other aspects will become apparent and more readily appreciated from the following description of the embodiments, taken in conjunction with the accompanying drawings in which.

DETAILED DESCRIPTION

Figure 1:
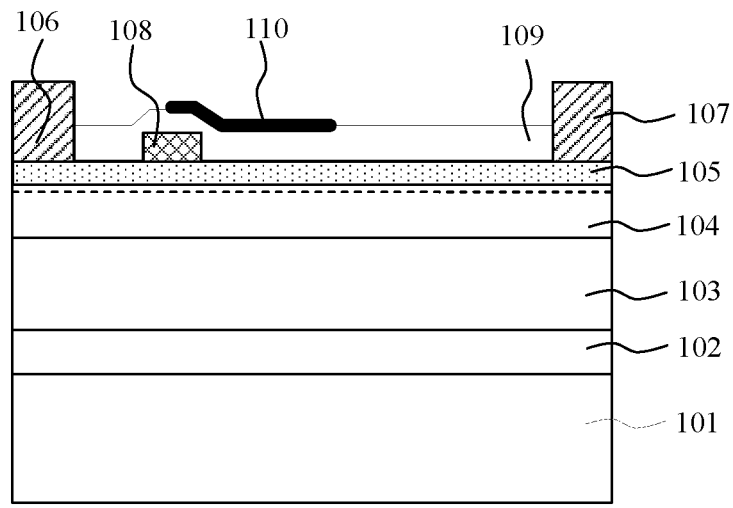
FIG. 1 illustrates a field plate power device according to the prior art.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein.

Accordingly, the embodiments are merely described below, by referring to the figures, to explain aspects of the present description.

Hereinafter embodiments of the present invention will be described in detail with reference to FIGS. 2-18D.

Figure 2:
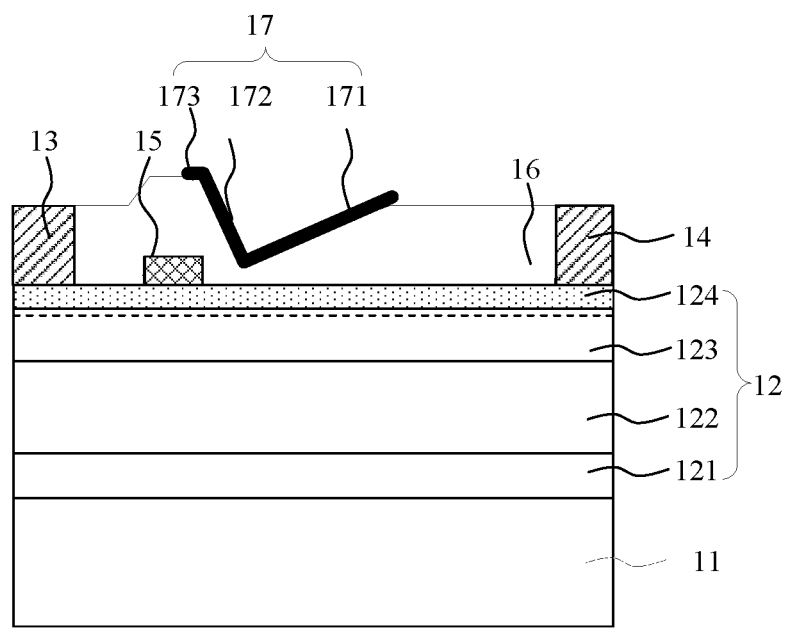
FIG. 2 illustrates a field plate power device according to a first embodiment of the present invention.

FIG. 2 illustrates a field plate power device according to a first embodiment of the present invention. As shown in FIG. 2, a field plate power device comprises: a substrate 11; a multilayer semiconductor layer 12 on the substrate 11; a source electrode 13, a drain electrode 14 and a gate electrode 15 between the source electrode 13 and the drain electrode 14 disposed on the multilayer semiconductor layer 12; a dielectric layer 16 disposed on the gate electrode 15, a part of the multilayer semiconductor layer 12 between the gate electrode 15 and the source electrode 13 and another part of the multilayer semiconductor layer 12 between the gate electrode 15 and the drain electrode 14; a groove in the dielectric layer 16 between the gate electrode 15 and the drain electrode 14, the inner wall of the groove having a tilted shape; and a field plate 17 on the inner wall of the groove.

The substrate 11 may be made of any one of silicon, sapphire, silicon carbide, insulating substrate silicon, gallium nitride, aluminum nitride, zinc oxide, or any other material capable of growing group III nitride.

The multilayer semiconductor layer 12 may be made of a semiconductor material of a group III-V compound, and may comprise a nucleation layer 21, a buffer layer 122, a channel layer 123 and a barrier layer 124 sequentially stacked on the substrate 11.

The nucleation layer 121 can affect parameters such as crystal quality, surface topography and electrical properties of heterojunction material disposed thereon, and thus serves to match substrate material and a semiconductor material layer in the heterojunction structure.

The buffer layer 122 protects the substrate 11 from some metal ions and bonds other semiconductor material layers to be grown thereon. The buffer layer 122 may be made of a group III nitride material such as AlGaN, GaN or AlGaInN.

The barrier layer 124 may be made of AlGaN. The channel layer 123 and the barrier layer 124 form the heterojunction structure in which a 2DEG channel (shown by the dashed line in FIG. 2) is formed at the heterojunction interface, where the channel layer 123 provides a channel for movement of 2DEG and the barrier layer 124 acts as a barrier.

The source electrode 13 and the drain electrode 14 on the barrier layer 124 are in contact with the 2DEG respectively. The gate electrode 15 is located between the source electrode 13 and the drain electrode 14, and is located on the barrier layer 124. The gate electrode 15 may be a T-shape gate electrode. When an appropriate bias voltage is applied to the gate electrode 15, a current flows between the source electrode 13 and the drain electrode 14 through the 2DEG conductive channel at an interface between the channel layer 123 and the barrier layer 124.

The dielectric layer 16 acts as passivation protection for the surface of the multilayer semiconductor layer 12 in the field plate power device.

A groove is formed in the dielectric layer 16 between the gate electrode 15 and the drain electrode 14. The groove has inner walls having tilted shapes on which the field plate 17 is deposited. As shown in FIG. 2, the field plate 17 includes a first portion 171 away from the gate electrode 15 in the horizontal direction, a second portion 172 connected to the first portion 171, and a third portion 173 adjacent to the gate electrode 15 in the horizontal direction. That is, the second portion 172 is located between the first portion 171 and the third portion 173. The first portion 171 has an overall upward tilted shape in the horizontal direction away from the gate electrode 15. That is, as the first portion 171 extends in the horizontal direction away from the gate electrode 15, the distance between the first portion 171 and the multilayer semiconductor layer 12 in the vertical direction is increased gradually. In particular, in this embodiment, the overall upward tilted shape of the first portion 171 is a tilted linear shape. That is, as the first portion 171 extends in the horizontal direction away from the gate electrode 15, the distance between the first portion 171 and the multilayer semiconductor layer 12 in the vertical direction is increased linearly.

Opposite to the extending trend of the first portion 171, the second portion 172 has an overall downward tilted shape in the horizontal direction away from the gate electrode 15. That is, as the second portion 172 extends in the horizontal direction away from the gate electrode 15, the distance between the second portion 172 and the multilayer semiconductor layer 12 in the vertical direction is decreased gradually. In particular, in this embodiment, the overall downward tilted shape of the second portion 172 is a tilted linear shape. That is, as the second portion 172 extends in the horizontal direction away from the gate electrode 15, the distance between the second portion 172 and the multilayer semiconductor layer 12 in the vertical direction is decreased linearly.

The third portion 173 is located substantially above the gate 15 and extends substantially horizontally.

In addition, as shown in FIG. 2, a length of the first portion 171 in the horizontal direction is larger than that of the second portion 172 in the horizontal direction. In particular, the length of the first portion 171 in the horizontal direction may be about 2 to 4 times as that of the second portion 171 in the horizontal direction. A length of the third portion 173 in the horizontal direction is less than those of the first portion 171 and the second portion 172 in the horizontal direction. Those skilled in the art will appreciate that the above is exemplary and this invention is not limited thereto.

With this structure, the field plate 17 can adjust electric field distribution on the surface of the power device when a voltage is applied to the drain electrode 14 from outside. Since an end of the field plate 17 away from the gate electrode 15 extends upward in the vertical direction, the electric field spike at the end of the field plate 17 is suppressed compared to the field plate in the prior art, the overall electric field distribution is more uniform and the electric field spike at an edge of the gate electrode 15 near the drain electrode 14 is also suppressed.

Figure 3:
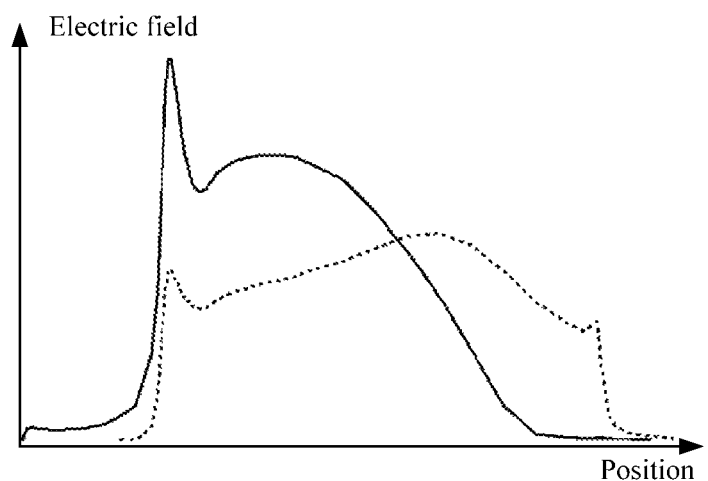
FIG. 3 is a schematic diagram of the electric field distribution of a field plate power device according to the first embodiment of the present invention and that according to prior art in a high voltage state.

FIG. 3 is a schematic diagram of the electric field distribution of the field plate power device according to the first embodiment of the present invention and that according to prior art in a high voltage state. In FIG. 3, the abscissa represents the position, the ordinate represents the electric field on the surface of the device, the solid line shows the electric field distribution on the surface of the field plate power device according to the prior art in a high voltage state, and the dotted line shows the electric field distribution on the surface of the field plate power device according to the first embodiment of the present invention in a high voltage state.

It can be seen from FIG. 3 that a new low electric field spike is formed near an end of the field plate according to the prior art since the bottom of the field plate is substantially parallel to the surface of the barrier layer, although the electric field spike near the edge of the gate electrode is reduced. The new electric field spike increases as the length of the field plate increases, which will lead to breakdown or failure in the region near the end of the field plate, and the problem of breakdown of the device has not been solved fundamentally. In contrast, there is no obvious high electric field spike in the power device according to the first embodiment of the present invention, and thus there is no region vulnerable to breakdown, which improves the overall breakdown voltage of the device. In addition, as the field plate extends away from the surface of the device, the generated parasitic capacitance effect is weakened gradually, which improves the high frequency characteristics of the device.

Hereinafter a method of manufacturing the field plate semiconductor device according to the present invention will be described in detail.

FIGS. 4A-4F are cross-sectional views illustrating steps of a method for manufacturing the field plate power device according to the first embodiment of the present invention, i.e., the field plate power device shown in FIG. 2.

Figure 4A:
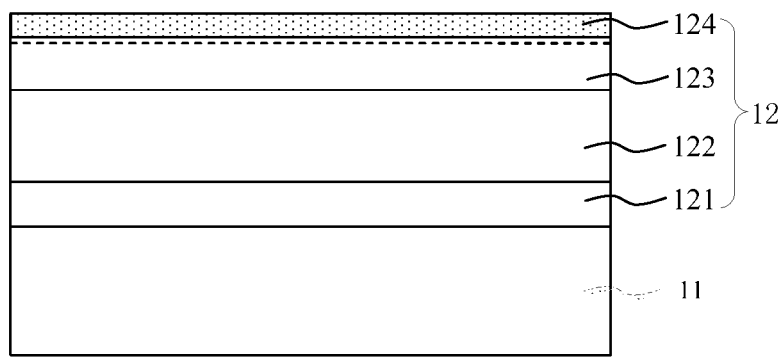
FIGS. 4A-4F are cross-sectional views illustrating steps of a method for manufacturing the field plate power device according to the first embodiment of the present invention.

Referring to FIG. 4A, the multilayer semiconductor layer 12 is formed on the substrate 11. Specifically, the nucleation layer 121, the buffer layer 122, the channel layer 123 and the barrier layer 124 are sequentially formed on the substrate 11. Here, the channel layer 123 and the barrier layer 124 form a heterojunction structure, and 2DEG is formed at an interface of the heterojunction structure.

Figure 4B:
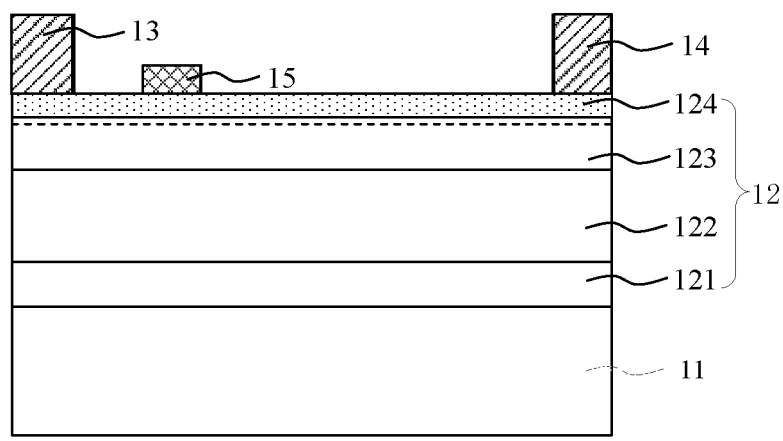

Referring to FIG. 4B, the source electrode 13, the drain electrode 14, and the gate electrode 15 located between the source electrode 13 and the drain electrode 14 are formed on the multilayer semiconductor layer 12. The source electrode 13 and the drain electrode 14 are in contact with the 2DEG at the heterojunction interface respectively. The source electrode 13 and the drain electrode 14 may be formed with a high-temperature annealing method or a heavy-doping method or an ion implantation method.

Figure 4C:
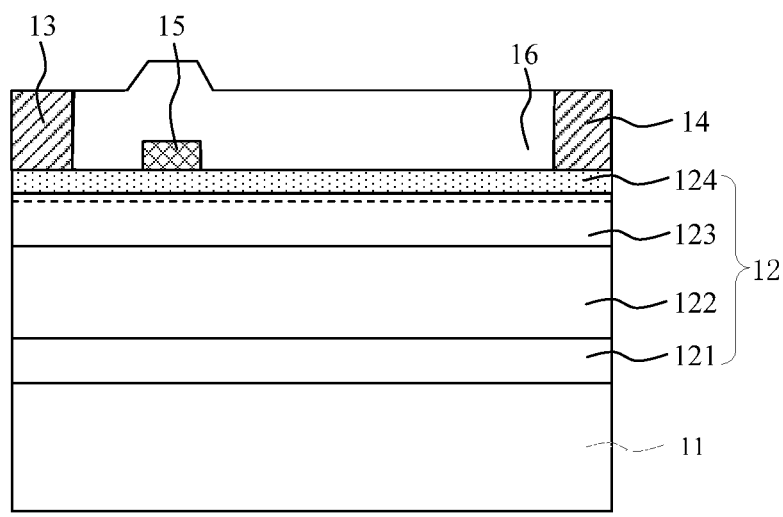

Referring to FIG. 4C, the dielectric layer 16 is formed on the gate electrode 15, a part of the multilayer semiconductor layer 12 between the gate electrode 15 and the source electrode 13, and another part of the multilayer semiconductor layer 12 between the gate electrode 15 and the drain electrode 14. The dielectric layer 16 functions as a passivation layer for protecting the surface of the field plate power device.

Figure 4D:
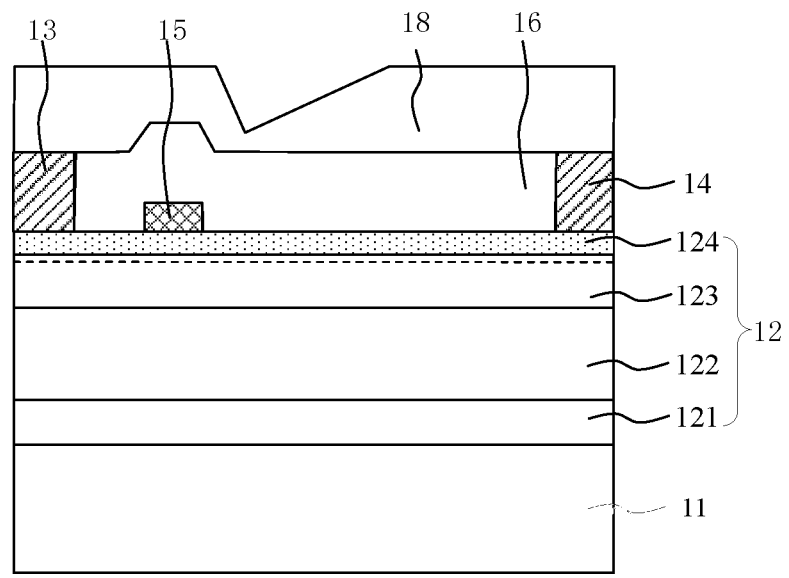
Figure 4E:
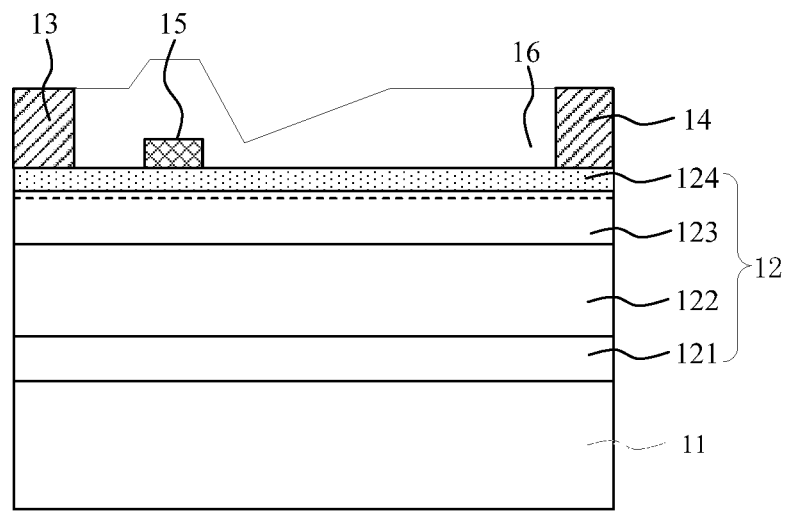

Referring to FIGS. 4D and 4E, a groove is formed in the dielectric layer 16. The groove includes a first portion away from the gate electrode 15 and a second portion adjacent to the gate electrode 15. In this embodiment, the first portion and the second portion have tilted linear shapes. A length of the first portion in the horizontal direction is greater than, e.g. 2 to 4 times as, a length of the second portion in the horizontal direction.

Specifically, the groove is formed in the dielectric layer 16 by a dry etching process or a wet etching process. For example, referring to FIG. 4D, a photolithographic process is performed on the dielectric layer 16 using a photoresist 18, and a mask plate (not shown) is used in the photolithographic process for the field plate region. Through adjusting density of light blocking point array on the mask plate, the exposure degree is increased gradually and then decreased gradually in the direction from the gate electrode 15 to the drain electrode 14. After being developed, the groove having a certain inclination is formed on the photoresist 18. In the present invention, the inclination of the groove is not limited, instead it can be determined based on the design requirements.

Referring to FIG. 4E, after forming the groove with a certain inclination on the photoresist 18, the photolithographic region is etched by a dry etching process. By optimizing the etching selectivity ratio of the photoresist 18 and the dielectric layer 16, for example, setting the etching selectivity ratio of the photoresist 18 and the dielectric layer 16 as 1:1, it can be ensured that the shape of the groove formed in the dielectric layer 16 after etching matches the shape of the groove in the photoresist 18. In this way, the groove having a certain inclination is formed in the dielectric layer 16. And as the groove extends towards the drain electrode 14, the distance between the bottom of the groove and the multilayer semiconductor layer 12 in the vertical direction is increased gradually.

Preferably, in order to control the distance between the groove and the multilayer semiconductor layer 12, an etching control layer may be inserted into the dielectric layer 16 to precisely control the etching depth so as to form a groove satisfying the design requirements.

It should be noted that in this step, during etching the groove in the dielectric layer 16 with a dry etching process, when the dielectric layer 16 on the gate electrode 15 is relatively thin, it can be etched completely; and when the dielectric layer 16 on the gate electrode 15 is relatively thick, it may be etched partially so as to form the structure shown in FIG. 4E.

Figure 4F:
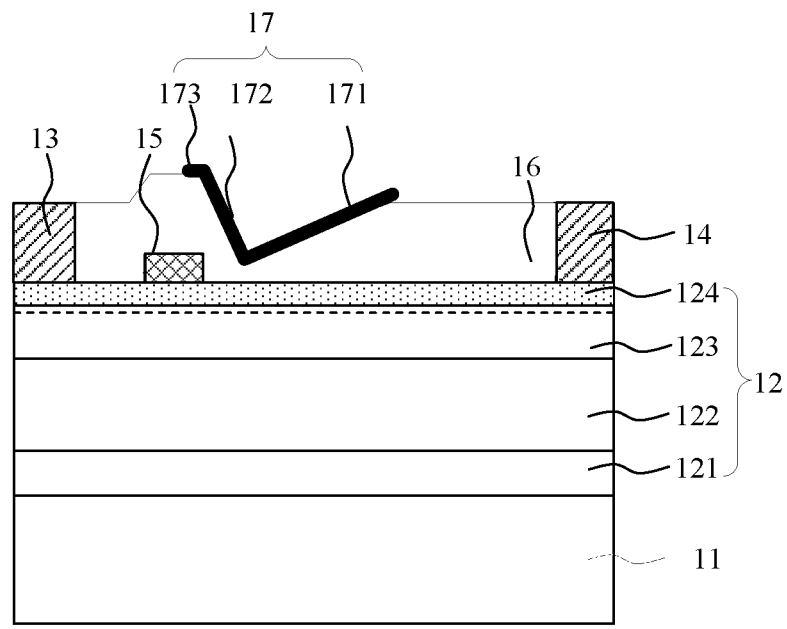

Referring to FIG. 4F, the field plate 17 including the first portion 171, the second portion 172 and the third portion 173 is formed on the inner walls of the groove. The field plate 17 is made of a metal. The field plate 17 can be formed on the inner walls of the groove by a metal evaporation process or a metal sputtering process or a metal chemical vapor deposition process. The field plate 17 completely covers the groove in the dielectric layer 16, such that the first and second portions 171 and 172 of the field plate 17 respectively have overall tilted shapes extending in different directions.

The length and thickness of the metal field plate 17 and the distance between the field plate 17 and the surface of the multilayer semiconductor layer 12 can be adjusted according to the design requirements of the power device.

It should be noted that although the process of forming the field plate is described as an example using mask plate lithography, dielectric etching, metal evaporation, etc., it is to be understood that the formation process of the field plate is not limited thereto, and the field plate may be formed by other methods known to those skilled in the art.

This invention can be applied to any device using a field plate, e.g., a high voltage laterally diffused metal oxide semiconductor (LDMOS) power device, a gallium nitride high electron mobility RF device, a power electronic device, a SiC power device, a GaAs device or other semiconductor devices.

The method of manufacturing the field plate power device provided by the embodiment of the present invention has the advantages of simple manufacturing process, decreased manufacturing cost, uniform electric field distribution on the surface of the power device, elimination of regions vulnerable to breakdown, improvement of the overall breakdown voltage of the power device and improvement of the high frequency characteristics of the power device.

FIGS. 5-9 illustrate variations of the field plate power device according to the first embodiment of the present invention.

Figure 5:
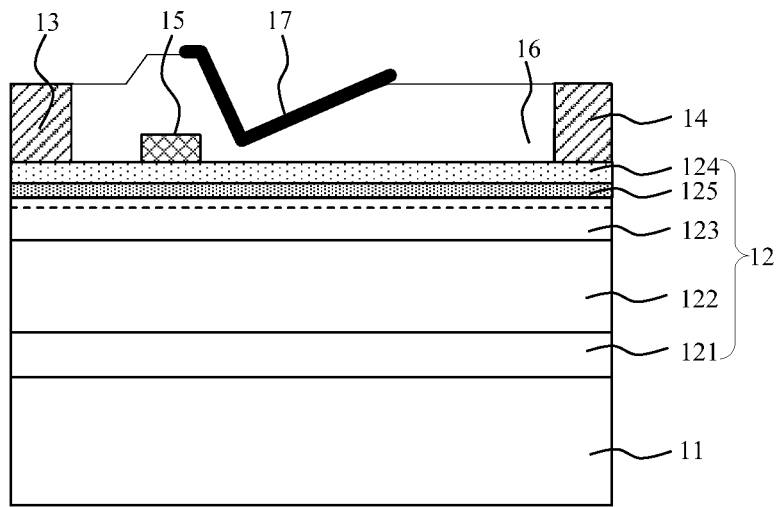
FIGS. 5-9 illustrate variations of the field plate power device according to the first embodiment of the present invention.

Preferably, as shown in FIG. 5, the multilayer semiconductor layer 12 further comprises an insertion layer 125 between the channel layer 123 and the barrier layer 124.

The insertion layer may be made of AlN.

Due to the very high band gap of AlN, the insertion layer 125 can limit the electrons in heterojunction wells more effectively, thereby increasing the concentration of 2DEG In addition, the insertion layer 125 separates the 2DEG conductive channel from the barrier layer 124. In this way, the scattering effect of the barrier layer 124 on the electrons is reduced, thus the mobility of the electrons is improved, and the overall characteristics of the device are improved.

Figure 6:
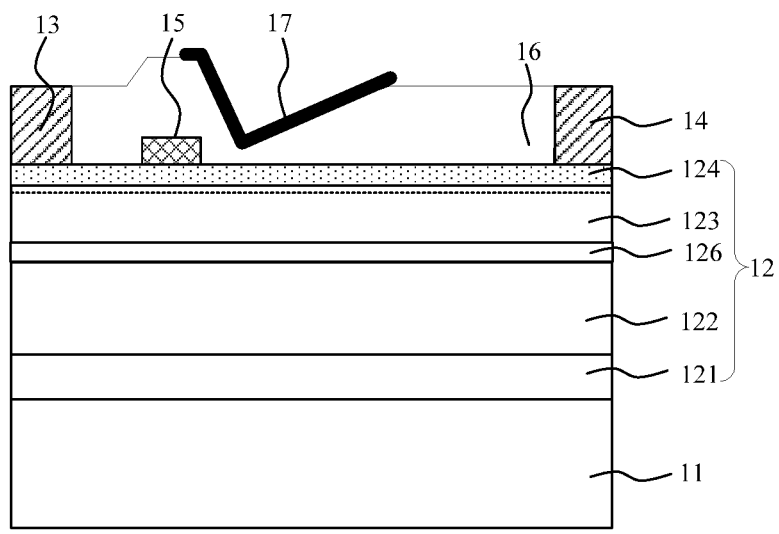

Preferably, as shown in FIG. 6, the multilayer semiconductor layer 12 further comprises a back barrier layer 126 between the buffer layer 122 and the channel layer 123. The back barrier layer 126 may be made of AlGaN.

Under a certain applied voltage, the electrons in the 2DEG conductive channel will enter into the buffer layer 122, especially in a short channel device, so that the control of the gate electrode 15 on the 2DEG conductive channel electrons is relatively weak, the short channel effect will occur. In addition, there are some defects and impurities in the buffer layer 122, which will impact the 2DEG in the channel, for example current collapse may occur. By introducing the AlGaN back barrier layer 126, the 2DEG conductive channel electron can be separated from the buffer layer 122, and the 2DEG can be limited in the channel layer 123 effectively, which reduces the short channel effect and the current collapse effect.

Figure 7:
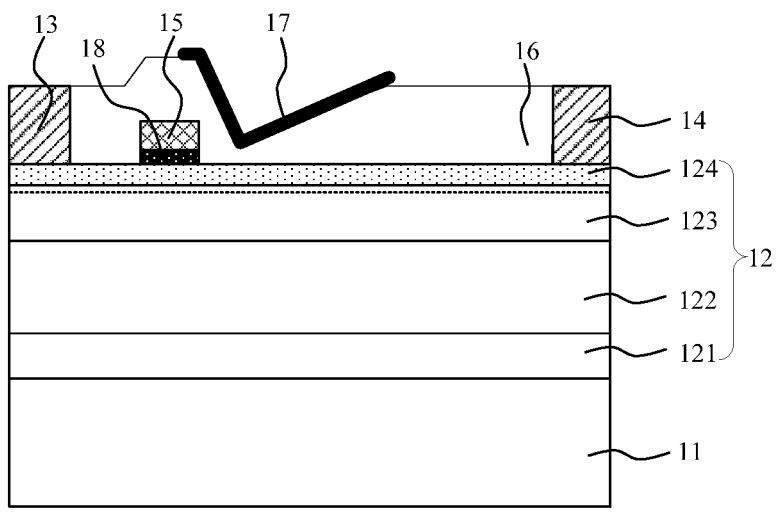

Preferably, as shown in FIG. 7, the field plate power device further comprises a gate dielectric layer 18 between the multilayer semiconductor layer 12 and the gate electrode 15.

The gate dielectric layer 18 can serve as both a passivation layer for the power device and a gate insulation layer, thereby reducing the leakage current of the gate electrode 15 effectively and adjusting the turn-on voltage. The gate dielectric layer 18 may be made of any of SiN, $SiO_2$, SiON, $Al_2O_3$, $HfO_2$ and HfAlOx, or any combination thereof.

Figure 8:
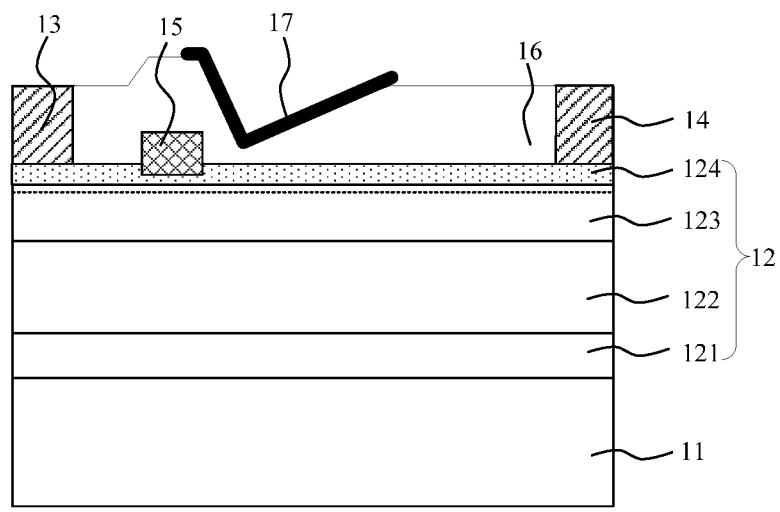

Preferably, as shown in FIG. 8, a recess is further formed in a part of the barrier layer 124 below the gate electrode 15, and the gate electrode 15 is at least partially disposed in the recess of the barrier layer 124. By etching the barrier layer 124 to form the recess and then depositing metal to form the gate electrode 15, surface defects of the material below the gate electrode 15 and the influence of the surface state can be reduced, the leakage current can be reduced, and the breakdown voltage can be increased. Furthermore, since the gate electrode 15 is close to the 2DEG conductive channel, the control effect on the 2DEG by the gate electrode 15 is strong, and the high-frequency characteristics of the device are improved. In this embodiment, it is required to control the etching depth of the barrier layer 124, and when the etching depth of the barrier layer 124 is large, the 2DEG under the recess may be reduced or eliminated, and the power device may be realized as an enhancement mode device.

Figure 9:
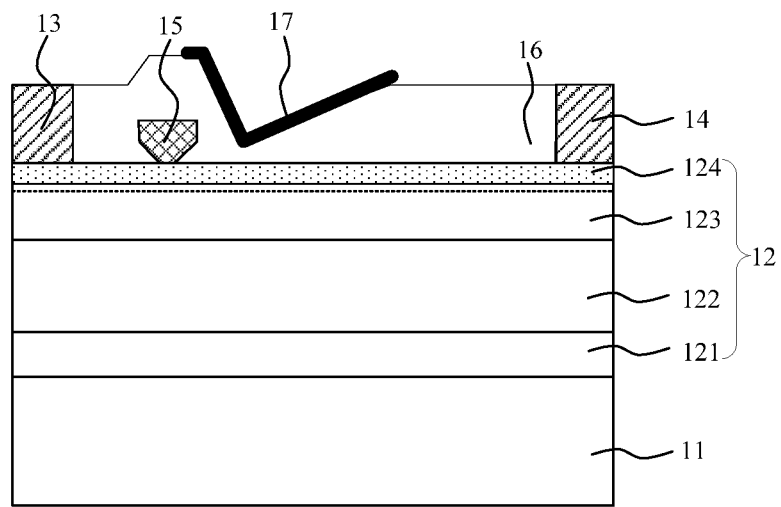

Preferably, as shown in FIG. 9, the gate electrode 15 may be a ramped gate electrode. By optimizing the etching conditions, a sloped recess can be formed during etching the dielectric layer 16 in the gate region, and the ramped gate electrode can be manufactured by depositing metal to the sloped recess. Such a technique can reduce the electric field intensity of an end of the gate electrode 15 near the drain electrode 14, and can reduce the leakage current of the gate electrode 15, thereby increasing the breakdown voltage of the device. Furthermore, the use of the ramped gate electrode structure does not introduce excessive parasitic capacitance, which has little impact on the high frequency characteristics of the device. The combination of the field plate 17 according to embodiments of the present invention and the ramped gate electrode structure can improve the characteristics of the device obviously.

With the field plate power device according to the first embodiment of the present invention and the manufacturing method thereof, the overall electric field distribution of the power device is more uniform compared with the prior art, and the electric field spike near the gate electrode of the power device is suppressed, and there is no obvious electric field spike on the surface of the power device, the region vulnerable to breakdown is eliminated. In this way, the overall breakdown voltage of the power device is increased, the high frequency characteristics of the power device are improved, and the processing difficulty and manufacturing cost is reduced.

Figure 10:
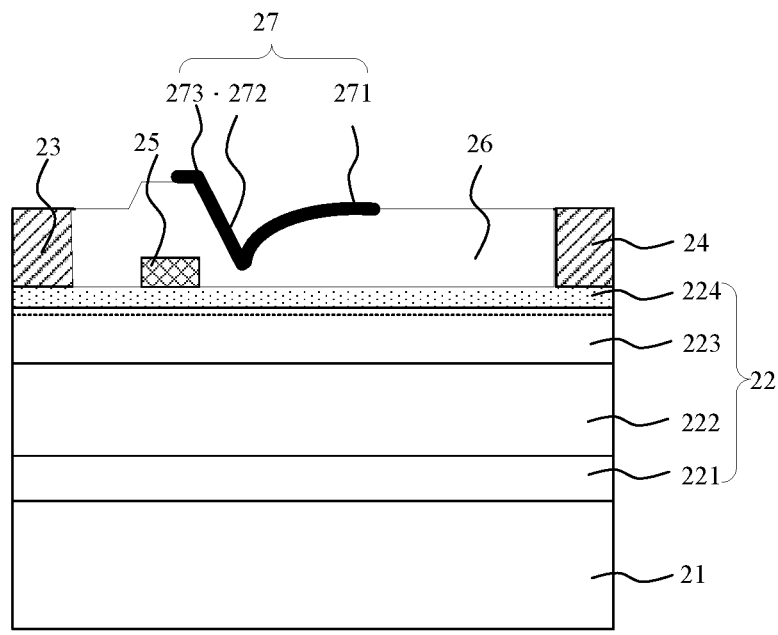
FIG. 10 illustrates a field plate power device according to a second embodiment of the present invention.

FIG. 10 illustrates a field plate power device according to a second embodiment of the present invention. As shown in FIG. 10, the field plate power device according to this embodiment comprises: a substrate 21; a multilayer semiconductor layer 22 on the substrate 21; a source electrode 23, a drain electrode 24 and a gate electrode 25 between the source electrode 23 and the drain electrode 24 disposed on the multilayer semiconductor layer 22; a dielectric layer 26 disposed on the gate electrode 25, a part of the multilayer semiconductor layer 22 between the gate electrode 25 and the source electrode 23 and another part of the multilayer semiconductor layer 22 between the gate electrode 25 and the drain electrode 24; a groove in the dielectric layer 26 between the gate electrode 25 and the drain electrode 24, the inner wall of the groove having a tilted shape; and a field plate 27 including a first portion 271, a second portion 272 and a third portion 273 on the inner wall of the groove. The multilayer semiconductor layer 22 includes a nucleation layer 221, a buffer layer 222, a channel layer 223 and a barrier layer 224 sequentially laminated on the substrate 21.

Except for the upward convex curved shape of the first portion 271 of the field plate 27, this embodiment is substantially the same as or similar to the first embodiment, and repeated description is omitted herein.

In this embodiment, a field plate with an upward convex curved shape can be formed by designing the light blocking dot array density on the mask plate. Different from the first embodiment in which the electric field distribution is optimized by adjusting the inclination angle, the electric field distribution can be optimized by adjusting the radian of the curved shape. The electric field distribution at an end of the field plate 27 near the drain electrode 24 can be regulated more flexibly, and the characteristics of the device can be further improved.

Figure 11:
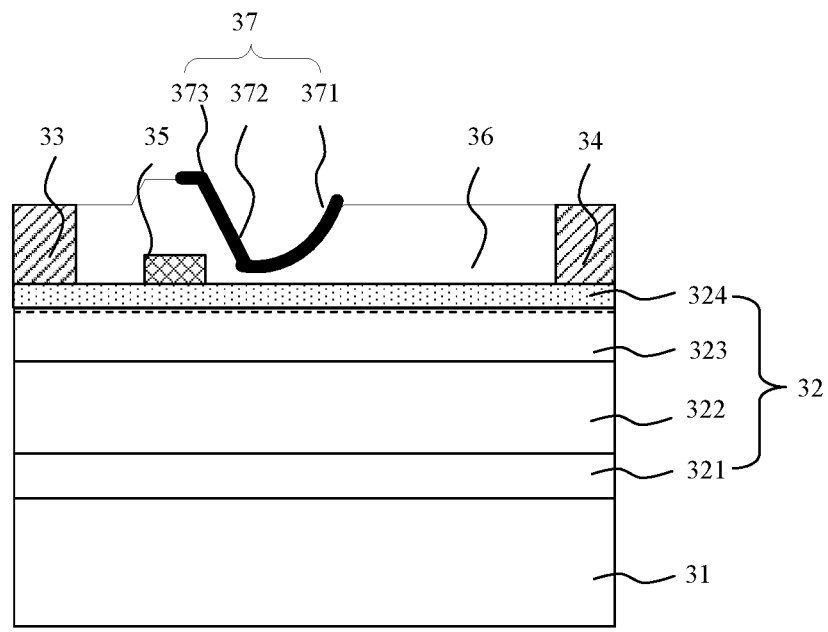
FIG. 11 illustrates a field plate power device according to a third embodiment of the present invention.

FIG. 11 illustrates a field plate power device according to a third embodiment of the present invention. As shown in FIG. 11, the field plate power device according to this embodiment comprises: a substrate 31; a multilayer semiconductor layer 32 on the substrate 31; a source electrode 33, a drain electrode 34 and a gate electrode 35 between the source electrode 33 and the drain electrode 34 disposed on the multilayer semiconductor layer 32; a dielectric layer 36 disposed on the gate electrode 35, a part of the multilayer semiconductor layer 32 between the gate electrode 35 and the source electrode 33 and another part of the multilayer semiconductor layer 32 between the gate electrode 35 and the drain electrode 34; a groove in the dielectric layer 36 between the gate electrode 35 and the drain electrode 34, the inner wall of the groove having a tilted shape; and a field plate 37 including a first portion 371, a second portion 372 and a third portion 373 on the inner wall of the groove. The multilayer semiconductor layer 32 includes a nucleation layer 321, a buffer layer 322, a channel layer 323 and a barrier layer 324 sequentially laminated on the substrate 31.

Except for the downward convex curved shape of the first portion 371 of the field plate 37, this embodiment is substantially the same as or similar to the first embodiment, and repeated description is omitted herein.

In this embodiment, a field plate with a downward convex curved shape can be formed by designing the light blocking dot array density on the mask plate. Different from the first embodiment in which the electric field distribution is optimized by adjusting the inclination angle, the electric field distribution can be optimized by adjusting the radian of the curved shape. The field plate with the downward convex curved shape can match the surface of the device well, so that the regulation for the electric field on the surface of the device can be improved.

Figure 12:
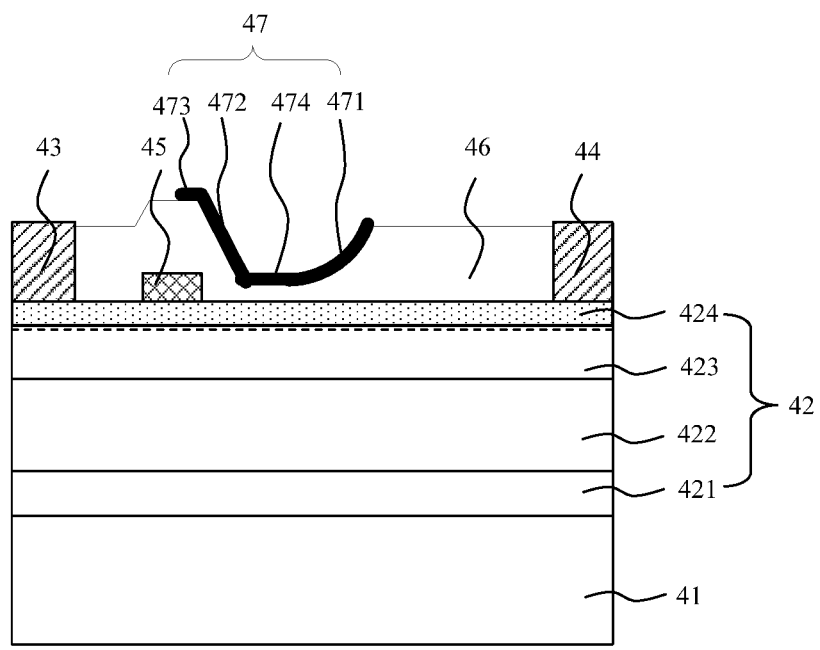
FIG. 12 illustrates a field plate power device according to a fourth embodiment of the present invention.

FIG. 12 illustrates a field plate power device according to a fourth embodiment of the present invention. As shown in FIG. 12, the field plate power device according to this embodiment comprises: a substrate 41; a multilayer semiconductor layer 42 on the substrate 41; a source electrode 43, a drain electrode 44 and a gate electrode 45 between the source electrode 43 and the drain electrode 44 disposed on the multilayer semiconductor layer 42; a dielectric layer 46 disposed on the gate electrode 45, a part of the multilayer semiconductor layer 42 between the gate electrode 45 and the source electrode 43 and another part of the multilayer semiconductor layer 42 between the gate electrode 45 and the drain electrode 44; a groove in the dielectric layer 46 between the gate electrode 45 and the drain electrode 44, the inner wall of the groove having a tilted shape; and a field plate 47 including a first portion 471, a second portion 472, a third portion 473 and a portion 474 on the inner wall of the groove. The multilayer semiconductor layer 42 includes a nucleation layer 421, a buffer layer 422, a channel layer 423 and a barrier layer 424 sequentially laminated on the substrate 41.

Except for the fourth portion 474 between the first portion 471 and the second portion 472, this embodiment is substantially the same as or similar to the third embodiment, and repeated description is omitted herein.

In this embodiment, the fourth portion 474 has a horizontal linear shape and is parallel to the multilayer semiconductor layer 42. The field plate according to this embodiment can be formed by designing the light blocking dot array density on the mask plate. With such a field plate, the electric field distribution on the surface of the device can be improved.

It will be appreciated by those skilled in the art that the downward convex curved shape of the first portion 471 can be replaced by a tilted linear shape or an upward convex curved shape.

Figure 13:
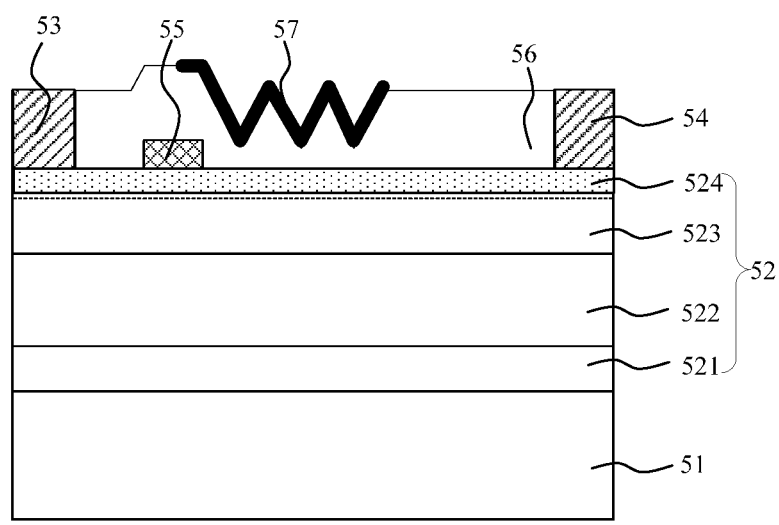
FIG. 13 illustrates a field plate power device according to a fifth embodiment of the present invention.

FIG. 13 illustrates a field plate power device according to a fifth embodiment of the present invention. As shown in FIG. 13, the field plate power device according to this embodiment comprises: a substrate 51; a multilayer semiconductor layer 52 on the substrate 51; a source electrode 53, a drain electrode 54 and a gate electrode 55 between the source electrode 53 and the drain electrode 54 disposed on the multilayer semiconductor layer 52; a dielectric layer 56 disposed on the gate electrode 55, a part of the multilayer semiconductor layer 52 between the gate electrode 55 and the source electrode 53 and another part of the multilayer semiconductor layer 52 between the gate electrode 55 and the drain electrode 54; a groove in the dielectric layer 56 between the gate electrode 55 and the drain electrode 54, the inner wall of the groove having a tilted shape; and a field plate 57 on the inner wall of the groove. The multilayer semiconductor layer 52 includes a nucleation layer 521, a buffer layer 522, a channel layer 523 and a barrier layer 524 sequentially laminated on the substrate 51.

Except that the first portion of the field plate 57, i.e., the portion away from the gate electrode 55 like the above-described embodiment, has a serrated shape, this embodiment is substantially the same as or similar to the first embodiment, and repeated description is omitted herein.

According to this embodiment, the distribution of the electric field at an end of the field plate 57 near the drain electrode 54 is more uniform. The size and the specific shape of the first portion of the field plate 57 can be determined based on design requirements. And the field plate 57 according to this embodiment can be made by designing light blocking dot array of the mask plate.

Figure 14:
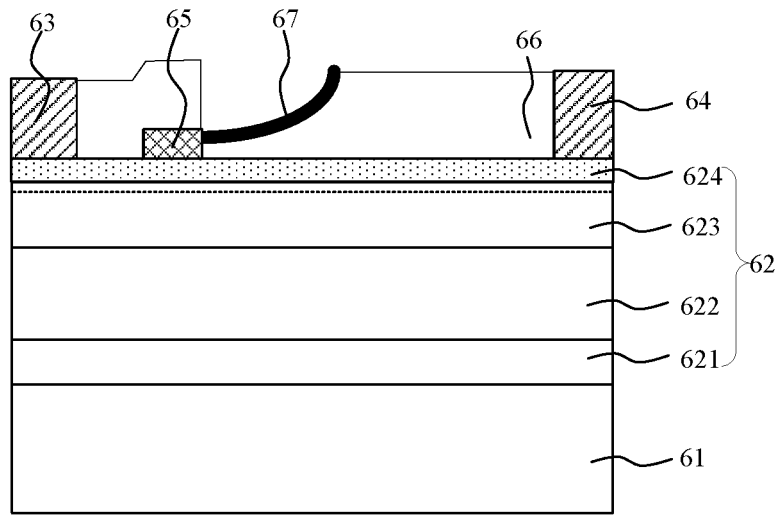
FIG. 14 illustrates a field plate power device according to a sixth embodiment of the present invention.

FIG. 14 illustrates a field plate power device according to a sixth embodiment of the present invention. As shown in FIG. 14, the field plate power device according to this embodiment comprises: a substrate 61; a multilayer semiconductor layer 62 on the substrate 61; a source electrode 63, a drain electrode 64 and a gate electrode 65 between the source electrode 63 and the drain electrode 64 disposed on the multilayer semiconductor layer 62; a dielectric layer 66 disposed on the gate electrode 65, a part of the multilayer semiconductor layer 62 between the gate electrode 65 and the source electrode 63 and another part of the multilayer semiconductor layer 62 between the gate electrode 65 and the drain electrode 64; a groove in the dielectric layer 66 between the gate electrode 65 and the drain electrode 64, the inner wall of the groove having a tilted shape; and a field plate 67 on the inner wall of the groove. The multilayer semiconductor layer 62 includes a nucleation layer 621, a buffer layer 622, a channel layer 623 and a barrier layer 624 sequentially laminated on the substrate 61.

Except that the field plate 67 partially covers the groove and an end thereof is directly connected to the gate electrode 65, this embodiment is substantially the same as or similar to the first embodiment, and repeated description is omitted herein.

It could be seen from FIG. 14 that the field plate 67 comprises the first portion only, without the second and third portions like in the above-described embodiments.

Since the field plate 67 is connected to the gate electrode 65 directly, the distribution of the electric field near an edge of the gate electrode 65 can be regulated more effectively, which improves the characteristics of the device.

In addition, according to this embodiment, the overall distribution of the electric field of the power device is more uniform. The electric field spike at an end of the gate electrode 65 near the drain electrode 64 is reduced, and there is no obvious high peak electric field on the surface of the power device. Regions vulnerable to breakdown are eliminated, the overall breakdown voltage of the power device and the high frequency characteristics of the power device are improved.

Alternatively, the end of the field plate 67 adjacent to the gate electrode 65 can be connected to the source electrode 63, or a fixed potential electrode (not shown), or is in a floating state.

Figure 15:
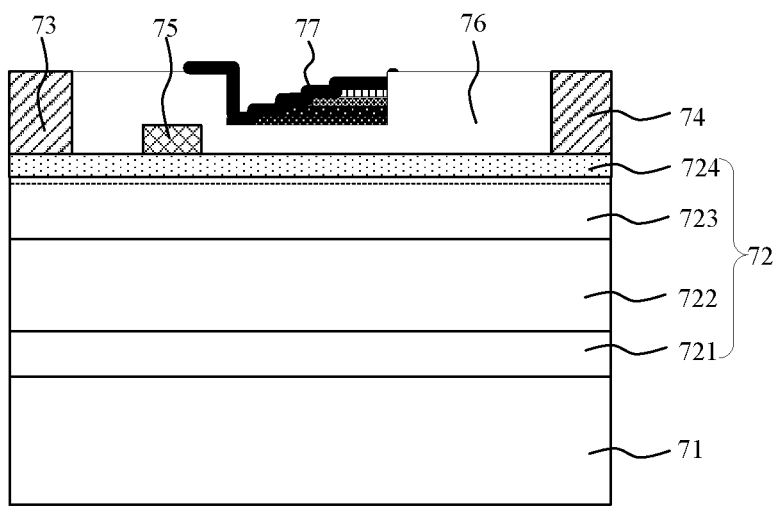
FIG. 15 illustrates a field plate power device according to a seventh embodiment of the present invention.

FIG. 15 illustrates a field plate power device according to a seventh embodiment of the present invention. As shown in FIG. 15, the field plate power device according to this embodiment comprises: a substrate 71; a multilayer semiconductor layer 72 on the substrate 71; a source electrode 73, a drain electrode 74 and a gate electrode 75 between the source electrode 73 and the drain electrode 74 disposed on the multilayer semiconductor layer 72; a dielectric layer 76 disposed on the gate electrode 75, a part of the multilayer semiconductor layer 72 between the gate electrode 75 and the source electrode 73 and another part of the multilayer semiconductor layer 72 between the gate electrode 75 and the drain electrode 74; a groove in the dielectric layer 76 between the gate electrode 75 and the drain electrode 74, the inner wall of the groove having a tilted shape; and a field plate 77 on the inner wall of the groove. The multilayer semiconductor layer 72 includes a nucleation layer 721, a buffer layer 722, a channel layer 723 and a barrier layer 724 sequentially laminated on the substrate 71.

Except that the first portion of the field plate 77, i.e., the portion away from the gate electrode 75 like the above-described embodiment, has a serrated shape and the second portion of the field plate 77, i.e., the portion connected with the first portion, has a vertical straight linear shape, this embodiment is substantially the same as or similar to the first embodiment, and repeated description is omitted herein.

Hereinafter the method of manufacturing the field plate 77 according to this embodiment will be described with reference to FIGS. 16A-16D.

Figure 16A:
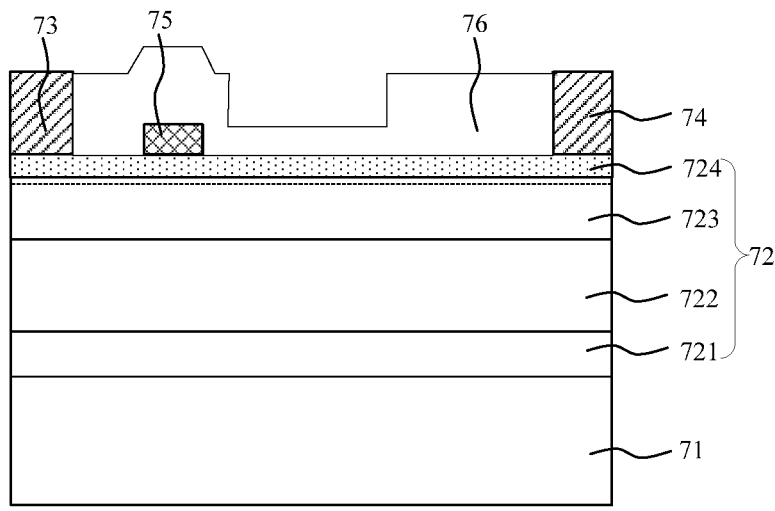
FIGS. 16A-16D are cross-sectional views illustrating steps of a method for manufacturing the field plate power device according to the seventh embodiment of the present invention.

Referring to FIG. 16A, a photolithography process is performed on a region in the dielectric layer 76 between the gate electrode 75 and the drain electrode 74 corresponding to the field plate 77 to be manufactured by using a photoresist, so that a groove is formed in the photoresist. Thereafter, a dry etching process is performed on the region. By optimizing the etching selectivity ratio of the photoresist and the dielectric layer 76, a groove matching the groove in the photoresist is formed in the dielectric layer 76.

Figure 16B:
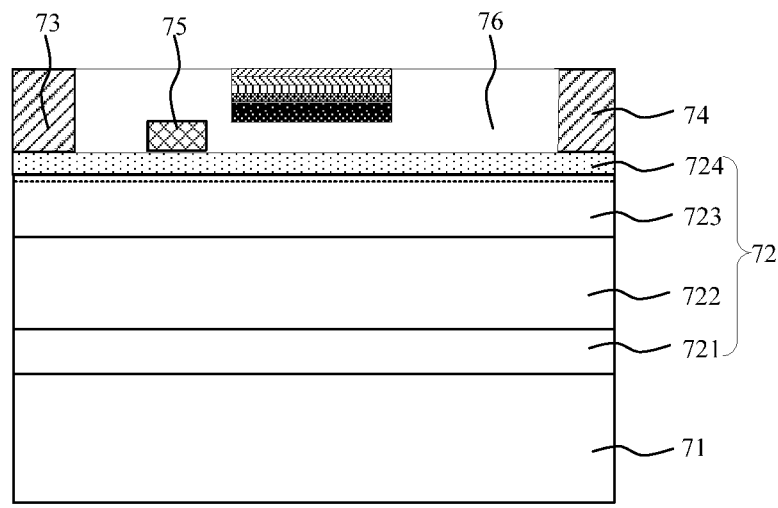

Referring to FIG. 16B, a multilayer SiOxNy (x and y are positive integers) structure is deposited in the groove in the dielectric layer 76 between the gate electrode 75 and the drain electrode 74. The composition ratios of various layers vary according to the design requirements. For example, the composition of Si decreases from the top layer to the bottom layer. Then a polishing process is performed to remove the SiOxNy layer outside the field plate region. In this step, a part of the dielectric layer 76 on the gate electrode 75 is polished as well, so as to form a structure in which the surface of the SiOxNy layer in the field plate region is flush.

Figure 16C:
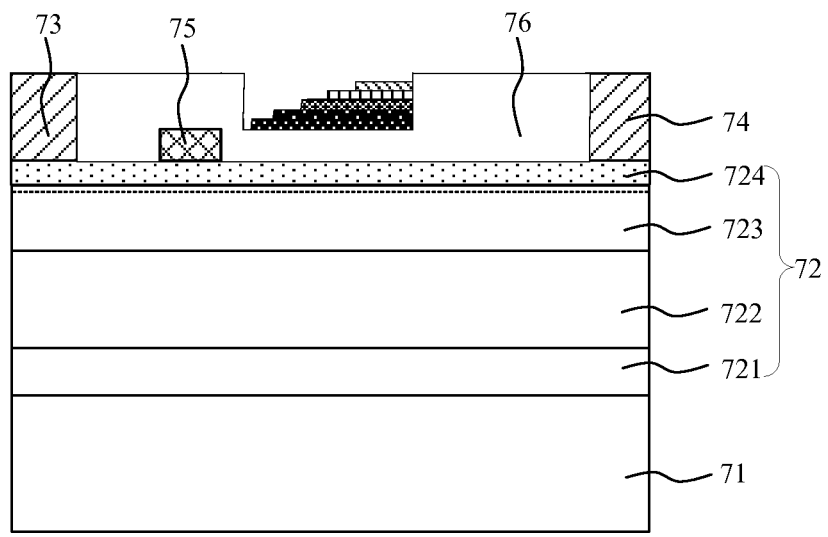

Referring to FIG. 16C, a photolithography process and a wet etching process are performed in the field plate region, and a desired serrated shaped groove is formed since different layer with different SiOxNy compositions have different etching rates.

Figure 16D:
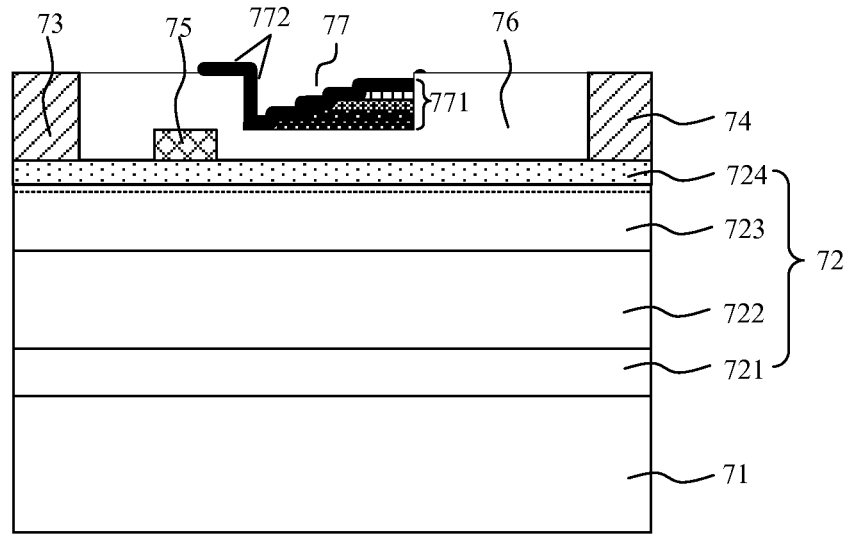

Referring to FIG. 16D, a metal is deposited in the groove by a metal evaporation process, so that the field plate 77 is formed.

Figure 17:
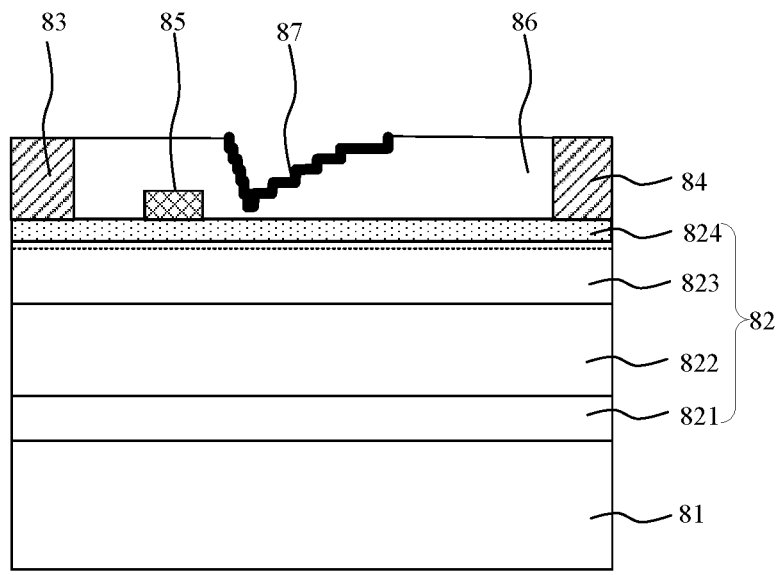
FIG. 17 illustrates a field plate power device according to an eighth embodiment of the present invention.

FIG. 17 illustrates a field plate power device according to an eighth embodiment of the present invention. As shown in FIG. 17, the field plate power device according to this embodiment comprises: a substrate 81; a multilayer semiconductor layer 82 on the substrate 81; a source electrode 83, a drain electrode 84 and a gate electrode 85 between the source electrode 83 and the drain electrode 84 disposed on the multilayer semiconductor layer 82; a dielectric layer 86 disposed on the gate electrode 85, a part of the multilayer semiconductor layer 82 between the gate electrode 85 and the source electrode 83 and another part of the multilayer semiconductor layer 82 between the gate electrode 85 and the drain electrode 84; a groove in the dielectric layer 86 between the gate electrode 85 and the drain electrode 84, the inner wall of the groove having a tilted shape; and a field plate 87 on the inner wall of the groove. The multilayer semiconductor layer 82 includes a nucleation layer 821, a buffer layer 822, a channel layer 823 and a barrier layer 824 sequentially laminated on the substrate 81.

Except that the second portion of the field plate 87 also has a serrated shape, this embodiment is substantially the same as or similar to the seventh embodiment, and repeated description is omitted herein.

Hereinafter the method of manufacturing the field plate 87 according to this embodiment will be described with reference to FIGS. 18A-18D.

Figure 18A:
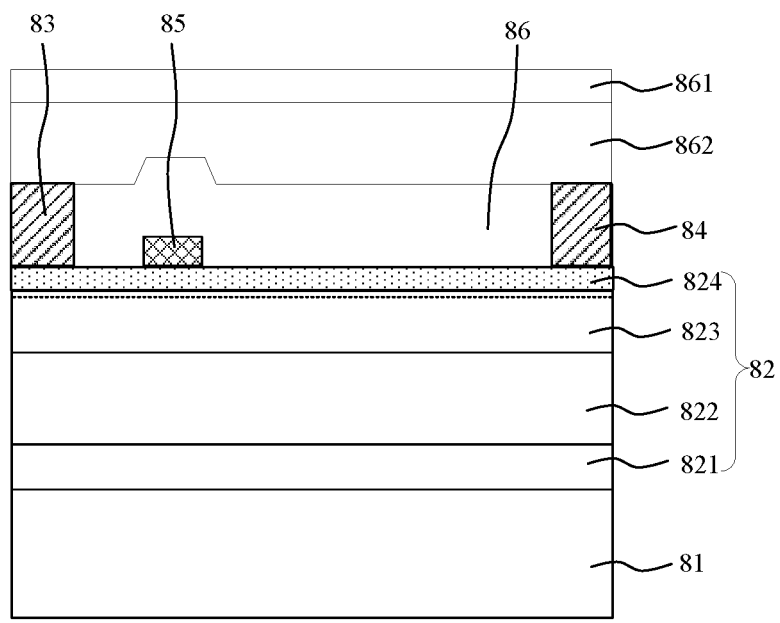
FIGS. 18A-18D are cross-sectional views illustrating steps of a method for manufacturing the field plate power device according to the eighth embodiment of the present invention.

Referring to FIG. 18A, a second photoresist 862 and a first photoresist 861 are sequentially coated on a part of the dielectric layer 86 between the gate electrode 85 and the drain electrode 84. Here, the first photoresist 861 can be washed with an organic solvent, and be dissolved in a developing solution after being exposed. The second photoresist 862 can be dissolved in a developing solution and a stripping liquid, and is insoluble in a conventional organic solvent.

Figure 18B:
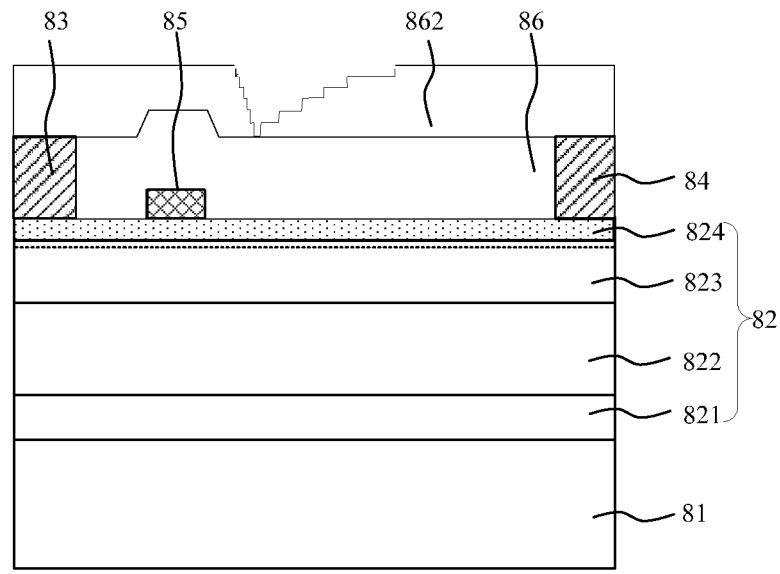

Referring to FIG. 18B, the first photoresist 861 is exposed and developed first, and a groove is formed on the second photoresist 862 by controlling the exposure window width and the developing time, and then the first photoresist 861 is washed with an organic solvent. The first photoresist 861 is re-coated. The previous exposing and developing process is repeated several times, and the exposure window width and the developing time are changed according to design requirements during each time, for example, the exposure window width is gradually changed. Finally, a groove with a serrated shape is formed in the second photoresist 862.

Figure 18C:
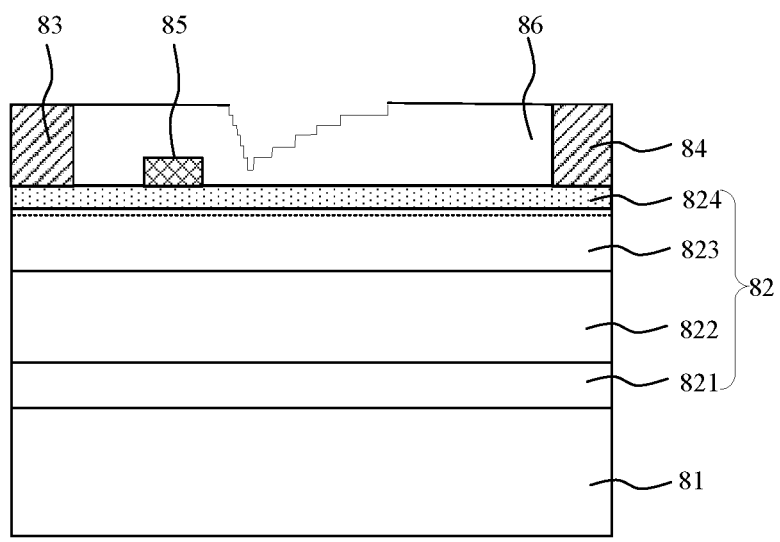

Referring to FIG. 18C, after the groove with the serrated shape is formed in the second photoresist 862, a dry etching process is performed on the photolithography region. By optimizing the etching selectivity ratio of the second photoresist 862 and the dielectric layer 86, a groove matching the groove in the second photoresist 862 is formed in the dielectric layer 86.

Figure 18D:
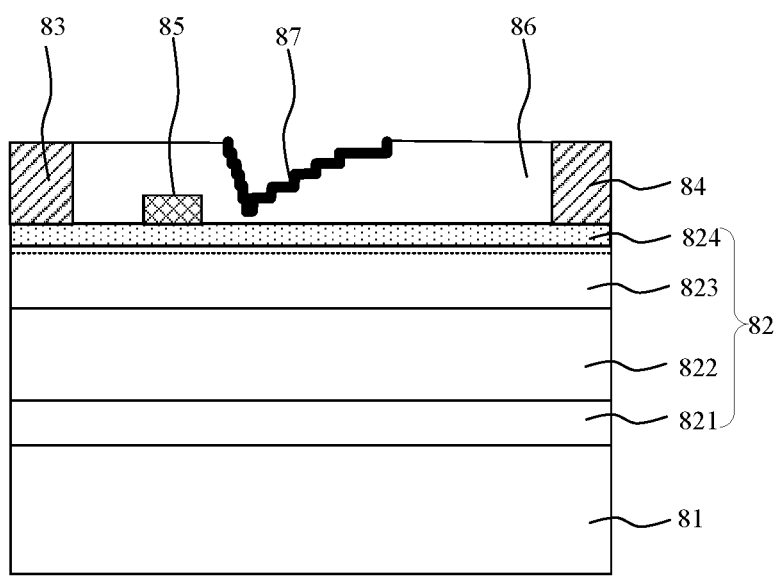

Referring to FIG. 18D, the field plate 87 is formed on the groove by a metal evaporation process.

With the field plate power devices according to the seventh and eighth embodiments of the present invention, the overall distribution of the electric field of the power device is more uniform. The electric field spike at an end of the gate electrode near the drain electrode is suppressed, and there is no obvious high peak electric field on the surface of the power device. The regions vulnerable to breakdown are eliminated, the overall breakdown voltage of the power device and the high frequency characteristics of the power device are improved.

It will be understood that the embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims and their equivalents.

What is claimed is:

1. A field plate power device, comprising:
   a substrate;
   a multilayer semiconductor layer disposed on the substrate;
   a source electrode, a drain electrode, and a gate electrode located between the source electrode and the drain electrode disposed on the multilayer semiconductor layer;
   a dielectric layer disposed on the gate electrode, a part of the multilayer semiconductor layer between the gate electrode and the source electrode and another part of the multilayer semiconductor layer between the gate electrode and the drain electrode;
   a groove disposed in a part of the dielectric layer between the gate electrode and the drain electrode; and
   a field plate disposed on the groove,
   wherein the field plate comprises a first portion away from the gate electrode in a horizontal direction, the first portion has a multi-layered structure disposed in the groove, and a distance between at least one part of the first portion and the multilayer semiconductor layer in a direction extending from the gate electrode to the drain electrode is increased gradually.

2. The field plate power device of claim 1, wherein the overall upward tilted shape of the first portion is one of a linear shape, an upward convex curved shape and a downward convex curved shape or a combination thereof.

3. The field plate power device of claim 1, wherein the overall upward tilted shape of the first portion is a serrated shape.

4. The field plate power device of claim 1, wherein the overall upward tilted shape of the first portion is a stepped shape.

5. The field plate power device of claim 1, wherein an end of the field plate is connected to one of the source electrode, the gate electrode and a fixed potential electrode, or is in a floating state.

6. The field plate power device of claim 1, wherein the field plate further comprises a second portion connected to the first portion, the second portion has an overall downward tilted shape in the horizontal direction away from the gate electrode.

7. The field plate power device of claim 1, wherein the field plate further comprises a second portion connected to the first portion, the second portion has a vertical straight linear shape.

8. The field plate power device of claim 1, wherein the multilayer semiconductor layer comprises a nucleation layer on the substrate, a buffer layer on the nucleation layer, a channel layer on the buffer layer and a barrier layer on the channel layer,
   wherein the channel layer and the barrier layer form a heterojunction structure, two-dimensional electron gas is formed at an interface of the heterojunction structure, the source electrode and the drain electrode respectively contact the two-dimensional electron gas.

9. The field plate power device of claim 1, further comprising a gate dielectric layer between the multilayer semiconductor layer and the gate electrode, the gate dielectric layer is made of a material selected from a group consisting of SiN, $SiO_2$, SiON, $Al_2O_3$, $HfO_2$ and $HfAlO_x$, or a combination thereof.

10. The field plate power device of claim 1, wherein the gate electrode is a T-shaped gate electrode or a ramped gate electrode.

11. The field plate power device of claim 6, wherein the overall downward tilted shape of the second portion is one of a linear shape, an upward convex curved shape, a downward convex curved shape and a stepped shape or a combination thereof.

12. The field plate power device of claim 6, wherein a length of the first portion in the horizontal direction is greater than a length of the second portion in the horizontal direction.

13. The field plate power device of claim 6, wherein the field plate further comprises a fourth portion between the first portion and the second portion, the fourth portion has a horizontal straight linear shape.

14. The field plate power device of claim 8, wherein the multilayer semiconductor layer further comprises an insertion layer made of AN between the channel layer and the barrier layer.

15. The field plate power device of claim 8, wherein the multilayer semiconductor layer further comprises a back barrier layer made of AlGaN between the buffer layer and the channel layer.

16. The field plate power device of claim 8, wherein the gate electrode is disposed on a surface of the barrier layer or at least partially disposed in a recess formed in the barrier layer.

17. A method of manufacturing a field plate power device, comprising:
   forming a multilayer semiconductor layer on a substrate;
   forming a source electrode, a drain electrode, and a gate electrode between the source electrode and the drain electrode on the multilayer semiconductor layer;
   forming a dielectric layer on the gate electrode, a part of the multilayer semiconductor layer between the gate electrode and the source electrode and another part of the multilayer semiconductor layer between the gate electrode and the drain electrode;
   forming a groove in a part of the dielectric layer between the gate electrode and the drain electrode; and
   forming a field plate on the groove, the field plate comprising a first portion away from the gate electrode in a horizontal direction, wherein the first portion has a multi-layered structure disposed in the groove, and a distance between at least one part of the first portion and the multilayer semiconductor layer in a direction extending from the gate electrode to the drain electrode is increased gradually.

18. The method of claim 17, wherein forming the multilayer semiconductor layer on the substrate comprises:
   forming a nucleation layer on the substrate;
   forming a buffer layer on the nucleation layer;
   forming a channel layer on the buffer layer; and
   forming a barrier layer on the channel layer,
   wherein the channel layer and the barrier layer form a heterojunction structure, two-dimensional electron gas is formed at an interface of the heterojunction structure, the source electrode and the drain electrode respectively contact the two-dimensional electron gas.

19. The method of claim 17, wherein the groove is formed by a dry etching process or a wet etching process.

20. The method of claim 17, wherein the field plate is formed by one of a metal electron beam evaporation process, a metal sputtering process and a metal chemical vapor deposition process or a combination thereof.

\* \* \* \* \*